(12) United States Patent  
Nakayama et al.

(10) Patent No.: US 10,014,838 B2  
(45) Date of Patent: Jul. 3, 2018

(54) GAIN ADJUSTMENT APPARATUS AND GAIN ADJUSTMENT METHOD

(71) Applicant: FUJITSU LIMITED, Kawasaki-shi, Kanagawa (JP)

(72) Inventors: Sayuri Nakayama, Kawasaki (JP); Taro Togawa, Kawasaki (JP); Takeshi Otani, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/672,405

(22) Filed: Aug. 9, 2017

(65) Prior Publication Data

US 2018/0062597 A1 Mar. 1, 2018

(30) Foreign Application Priority Data

Aug. 24, 2016 (JP) ................. 2016-164153

(51) Int. Cl.
*H04R 3/00* (2006.01)
*H04R 3/02* (2006.01)
(Continued)

(52) U.S. Cl.
CPC ............. *H03G 3/20* (2013.01); *G10L 17/005* (2013.01); *G10L 21/0216* (2013.01);
(Continued)

(58) Field of Classification Search
CPC . G10L 21/00; G10L 21/0232; G10L 21/0272; G10L 2021/02166; H04R 3/002; H04R 3/005
(Continued)

(56) References Cited

U.S. PATENT DOCUMENTS

2011/0131044 A1* 6/2011 Fukuda ................. G10L 15/20  
704/246  
2011/0182437 A1* 7/2011 Kim .................... G10L 21/0232  
381/73.1  
(Continued)

FOREIGN PATENT DOCUMENTS

JP 2005-77731 A 3/2005  
JP 2007-129373 A 5/2007  
WO 2012/023268 A1 2/2012

OTHER PUBLICATIONS

Extended European Search Report dated Dec. 14, 2017, issued in counterpart European Application No. 17186408.5. (6 pages).

*Primary Examiner* — Melur Ramakrishnaiah  
(74) *Attorney, Agent, or Firm* — Westerman, Hattori, Daniels & Adrian, LLP

(57) ABSTRACT

A gain adjustment apparatus includes a first output device configured to output a first audio signal, a second output device configured to output a second audio signal, a memory, and a processor coupled to the memory and configured to convert the first audio signal and the second audio signal to a first frequency spectrum and a second frequency spectrum, calculate an estimated difference between the first frequency spectrum and the second frequency spectrum based on a comparison of the first frequency spectrum with the second frequency spectrum, and output a first and second adjustment spectra corresponding to the first and second frequency spectra, the first and second adjustment spectra being adjusted on the basis of the first and second frequency spectra and the estimated difference.

8 Claims, 23 Drawing Sheets

(51) Int. Cl.
*H03G 3/20* (2006.01)
*G10L 21/0272* (2013.01)
*G10L 21/0216* (2013.01)
*G10L 17/00* (2013.01)
*H04R 1/08* (2006.01)
*H04R 1/00* (2006.01)

(52) U.S. Cl.
CPC ............ *G10L 21/0272* (2013.01); *H04R 1/08* (2013.01); *H04R 1/00* (2013.01)

(58) Field of Classification Search
USPC ......... 381/107, 71.2, 92, 311, 119; 704/208, 704/207, 202, 226, 258
See application file for complete search history.

(56) References Cited

U.S. PATENT DOCUMENTS

2011/0313763 A1    12/2011  Amada
2014/0355776 A1*   12/2014  Park ................... G10L 21/0208
                                                            381/71.2
2016/0241954 A1     8/2016  Furuta

* cited by examiner

FIG. 5

| VARIABLE | DETAIL OF VARIABLE |
|---|---|
| t | TIME |
| p | ANALYSIS START TIME |
| T | FRAME LENGTH |
| l | FRAME NUMBER |
| k | FREQUENCY |
| n | AUDIO SIGNAL NUMBER |
| $x_n(t)$ | AUDIO SIGNAL |
| $X_n(l,k)$ | AUDIO SIGNAL SPECTRUM |

FIG. 6

| VARIABLE | DETAIL OF VARIABLE |
|---|---|
| C(I) | RESULT OF ESTIMATING SPEAKING STATES |

FIG. 7

| VARIABLE | DETAIL OF VARIABLE |
|---|---|
| $d(l)$ | AVERAGE OF INSTANT DIFFERENCES BETWEEN LEVELS |
| $D_n(l,k)$ | ESTIMATED DIFFERENCE BETWEEN LEVELS WHEN SPEAKER STAYING ON SIDE OF n-TH MICROPHONE IS SPEAKING |
| $\alpha$ | PREDETERMINED SMOOTHING COEFFICIENT (= 0.01 OR THE LIKE) |

FIG. 8

| VARIABLE | DETAIL OF VARIABLE |
|---|---|
| Nn(l,k) | n-TH BACKGROUND NOISE SPECTRUM |

FIG. 9

| VARIABLE | DETAIL OF VARIABLE |
|---|---|
| $V_n(l,k)$ | n-TH CORRECTED AMOUNT |
| $G_n(l,k)$ | n-TH GAIN |
| TH1 | AUDIO DETERMINATION THRESHOLD |

FIG. 10

| VARIABLE | DETAIL OF VARIABLE |
|---|---|
| Sn(l,k) | n-TH ESTIMATED AUDIO SPECTRUM |
| sn( t ) | n-TH ESTIMATED AUDIO SIGNAL |

FIG. 14

| VARIABLE | DETAIL OF VARIABLE |
|---|---|
| t | TIME |
| p | ANALYSIS START TIME |
| l | FRAME NUMBER |
| k | FREQUENCY RANGE (FREQUENCY) |
| n | INPUT SIGNAL NUMBER |
| xn(t) | n-TH INPUT SIGNAL |
| Xn(l,k) | n-TH INPUT SIGNAL SPECTRUM |
| Nn(l,k) | n-th BACKGROUND NOISE SPECTRUM |

FIG. 15

| VARIABLE | DETAIL OF VARIABLE |
|---|---|
| $F(l-1,k)$ | STATE VARIATION FLAG |

FIG. 16

| VARIABLE | DETAIL OF VARIABLE |
|---|---|
| C(I) | RESULT OF ESTIMATING SPEAKING STATES |

FIG. 17

| VARIABLE | DETAIL OF VARIABLE |
|---|---|
| dnm(l) | INSTANT LEVEL DIFFERENCE |
| DAn(l,k) | ESTIMATED DIFFERENCE BETWEEN LEVELS WHEN SPEAKER STAYING ON SIDE OF n-TH MICROPHONE IS SPEAKING |
| $\beta$ | PREDETERMINED SMOOTHING COEFFICIENT (= 0.01 OR THE LIKE) |

FIG. 18

| FREQUENCY | DAMPING RATIO $R_n(k)$ |
|---|---|
| 100Hz | 1.2 |
| 1kHz | 1.0 |
| ... | ... |
| 4kHz | 0.7 |

FIG. 19

| VARIABLE | DETAIL OF VARIABLE |
|---|---|
| $VA_n(l,k)$ | n-TH CORRECTED AMOUNT |
| $r_n(l,k)$ | MEASURED DAMPING RATIO |
| TH2 | PREDETERMINED DETERMINATION THRESHOLD (= 0.1 OR THE LIKE) |
| Y | CORRECTION COEFFICIENT (= 0.1 OR THE LIKE) |

FIG. 20

| VARIABLE | DETAIL OF VARIABLE |
|---|---|
| $\xi n$ | n-TH PREDETERMINED MAGNIFICATION |
| SAn(i,k) | n-TH ESTIMATED SPECTRUM |

US 10,014,838 B2

GAIN ADJUSTMENT APPARATUS AND GAIN ADJUSTMENT METHOD

CROSS-REFERENCE TO RELATED APPLICATION

This application is based upon and claims the benefit of priority of the prior Japanese Patent Application No. 2016-164153, filed on Aug. 24, 2016, the entire contents of which are incorporated herein by reference.

FIELD

The embodiments discussed herein are related to a gain adjustment apparatus and a gain adjustment method.

BACKGROUND

As a technique for extracting only a target audio source from different audio sources, there is a binary masking processing technique. The binary masking processing technique is to acquire audio with multiple microphones and separate the audio sources from one another based on the comparison of magnitudes of the audio acquired by the microphones.

In order to improve the accuracy of separating the audio sources, it is preferable to calibrate gains of the microphones before a process of separating the audio sources. For example, according to Japanese Laid-open Patent Publication No. 2007-129373, a calibration signal for gain adjustment is output from an audio source, the sensitivity of receiving the calibration signal by a standard microphone serving as a standard for the calibration is used as a standard value, and the sensitivity of receiving the calibration signal by another microphone to be calibrated is compared with the standard value. By generating calibration information of the microphones based on the result of the comparison, gains of the multiple microphones are adjusted.

Other examples of related art are International Publication Pamphlet No. WO2012/023268 and Japanese Laid-open Patent Publication No. 2005-077731.

SUMMARY

According to an aspect of the invention, a gain adjustment apparatus includes a first output device configured to output a first audio signal, a second output device configured to output a second audio signal, a memory, and a processor coupled to the memory and configured to convert the first audio signal and the second audio signal to a first frequency spectrum and a second frequency spectrum, calculate an estimated difference between the first frequency spectrum and the second frequency spectrum based on a comparison of the first frequency spectrum with the second frequency spectrum, and output a first and second adjustment spectra corresponding to the first and second frequency spectra, the first and second adjustment spectra being adjusted on the basis of the first and second frequency spectra and the estimated difference.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 illustrates a list of variables to be used by each of frequency converters;

FIG. 6 illustrates a list of a variable to be used by a speaking state estimating section;

FIG. 7 illustrates a list of variables to be used by a level difference estimating section;

FIG. 8 illustrates a list of a variable to be used by each of noise estimating sections;

FIG. 9 illustrates a list of variables to be used by a gain calculator;

FIG. 10 illustrates a list of variables to be used by each of gain adders and each of inverse converters;

FIG. 14 illustrates a list of variables to be used by each of frequency converters;

FIG. 15 illustrates a state variation flag for determining whether or not a gain calculation process is to be executed by a speaking state estimating section;

FIG. 16 illustrates a list of a variable to be used by the speaking state estimating section;

FIG. 17 illustrates a list of variables to be used by a level difference estimating section;

FIG. 18 illustrates a damping ratio table stored for frequencies of a spectrum in a damping ratio storage section;

FIG. 19 illustrates a list of variables to be used by a gain calculator;

FIG. 20 illustrates a list of variables to be used by each of gain adders;

DESCRIPTION OF EMBODIMENTS

If an obstacle such as a person or a piece of baggage moves to or is placed on an audio delivery path extending from an audio source to a microphone during the delivery of audio from the audio source, the audio to be received by the microphone is affected by the obstacle. Even if a gain of the microphone has previously been calibrated, the magnitude of the audio received by the microphone changes due to an effect of the obstacle after the start of the reception, and the accuracy of audio source separation is reduced. Techniques disclosed herein aim to suppress a change in the magnitude of received audio even if the state of an audio delivery path changes over time.

First Embodiment

Figure 1:
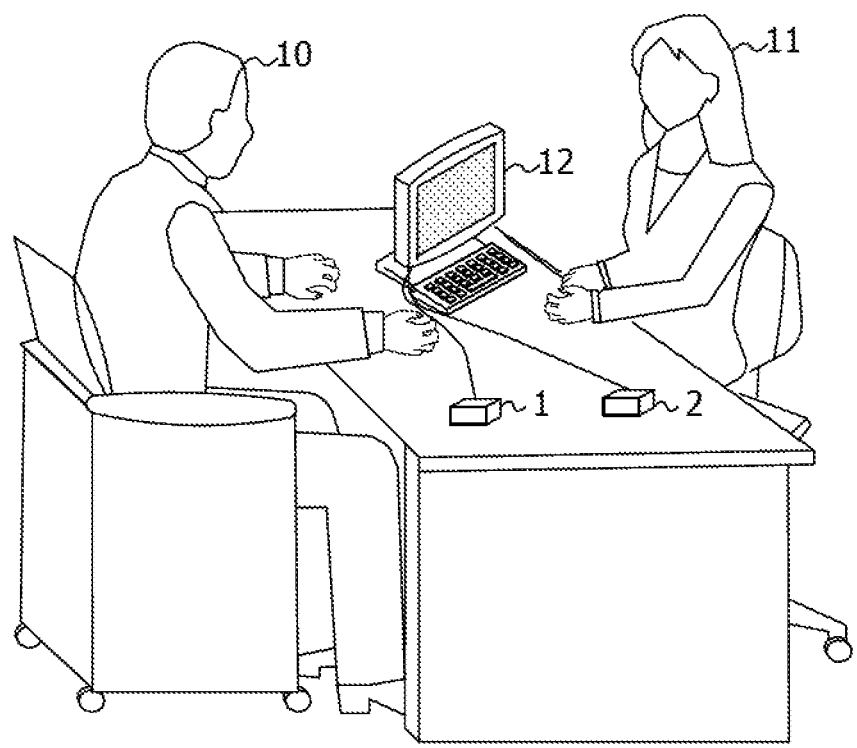
FIG. 1 is a conceptual diagram illustrating an example of the use of a gain adjustment apparatus according to a first embodiment.

FIG. 1 is a conceptual diagram illustrating an example of the use of a gain adjustment apparatus according to a first embodiment. The conceptual diagram illustrates a speaker 10, a speaker 11, a microphone 1, a microphone 2, and a computer 12. In FIG. 1, the microphone 1 is placed near the speaker 10, and the microphone 2 is placed near the speaker 11. Audio spoken by the speakers 10 and 11 is received by the microphones 1 and 2. The speakers 10 and 11 are examples of audio sources that output audio. The microphones 1 and 2 convert the received audio to electric signals and cause the converted electric signals to be input to the computer 12. The microphones 1 and 2 may be output devices that output audio signals recorded in advance. The gain adjustment apparatus is functionally achieved as a software program installed in the computer 12, for example.

Figure 2:
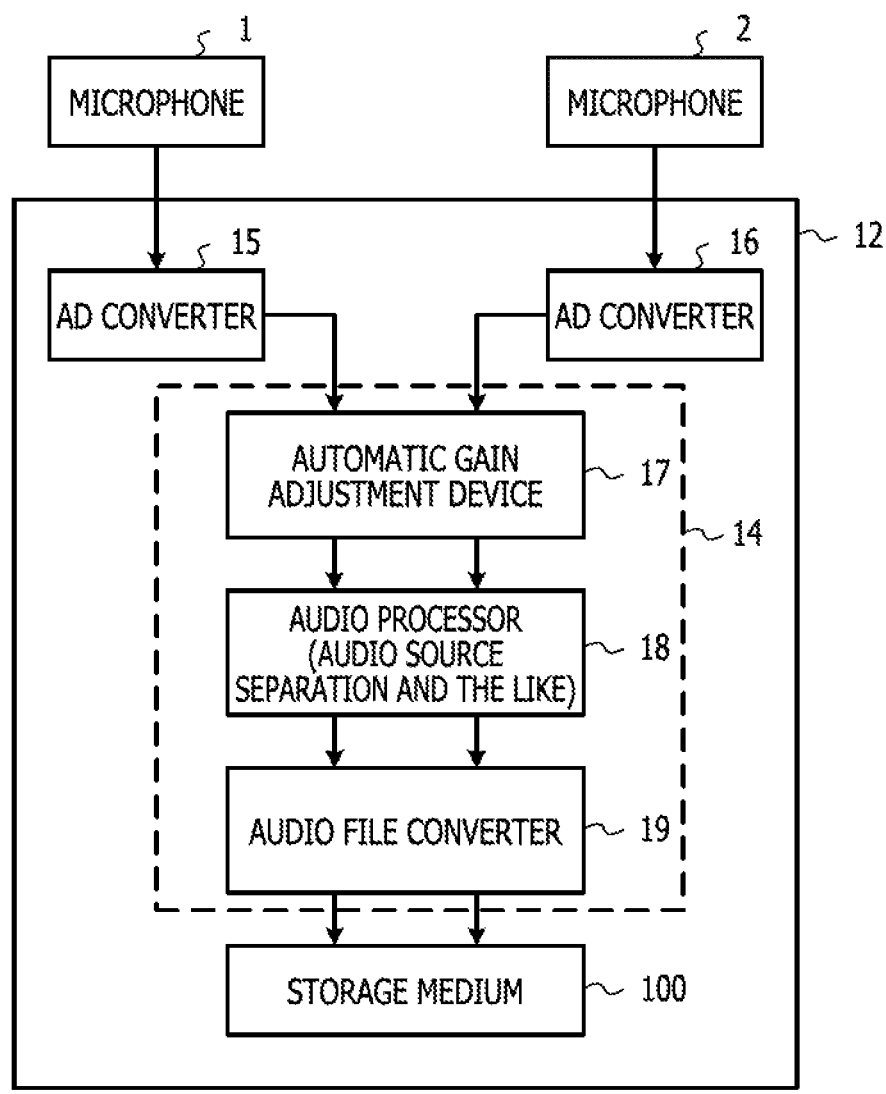
FIG. 2 is an example of a hardware block diagram of a computer.

FIG. 2 is an example of a hardware block diagram of the computer 12. The computer 12 includes an AD converter 15, an AD converter 16, an arithmetic processor 14, and a storage medium 100.

The AD converters 15 and 16 convert the analog electric signals received from the microphones 1 and 2 to digital signals and output the digital signals. The arithmetic processor 14 executes a program stored in the storage medium 100 or the like and functionally achieves an automatic gain adjustment device 17, an audio processor 18, and an audio file converter 19. The arithmetic processor 14 may be a central processing unit (CPU), a digital signal processor (DSP), or the like, for example. The automatic gain adjustment device 17, the audio processor 18, and the audio file converter 19 may be implemented as hardware in a logic circuit and an analog circuit. In FIG. 2, the audio processor 18 and the audio file converter 19 are not included in the automatic gain adjustment device 17. The automatic gain adjustment device 17, however, may include the audio processor 18 and the audio file converter 19.

The automatic gain adjustment device 17 automatically adjusts gains based on the digital signals received from the AD converters 15 and 16 so that the audio signals are not degraded. The automatic gain adjustment device 17 adjusts the amplitudes of the received digital signals based on the adjusted gains and outputs the digital signals after the adjustment.

The audio processor 18 executes an audio source separation process on the digital signals output from the automatic gain adjustment device 17. For example, as a technique for the audio source separation process, the aforementioned binary masking processing technique may be used. The audio processor 18 outputs the digital signals subjected to the audio source separation process and corresponding to the audio spoken by the speakers 10 and 11.

The audio file converter 19 converts the received digital signals to an audio file and outputs the audio file. The storage medium 100 stores the audio file received from the audio file converter 19.

As described above, the computer 12 causes the arithmetic processor 14 to execute the program, thereby achieving the automatic gain adjustment function.

Figure 3:
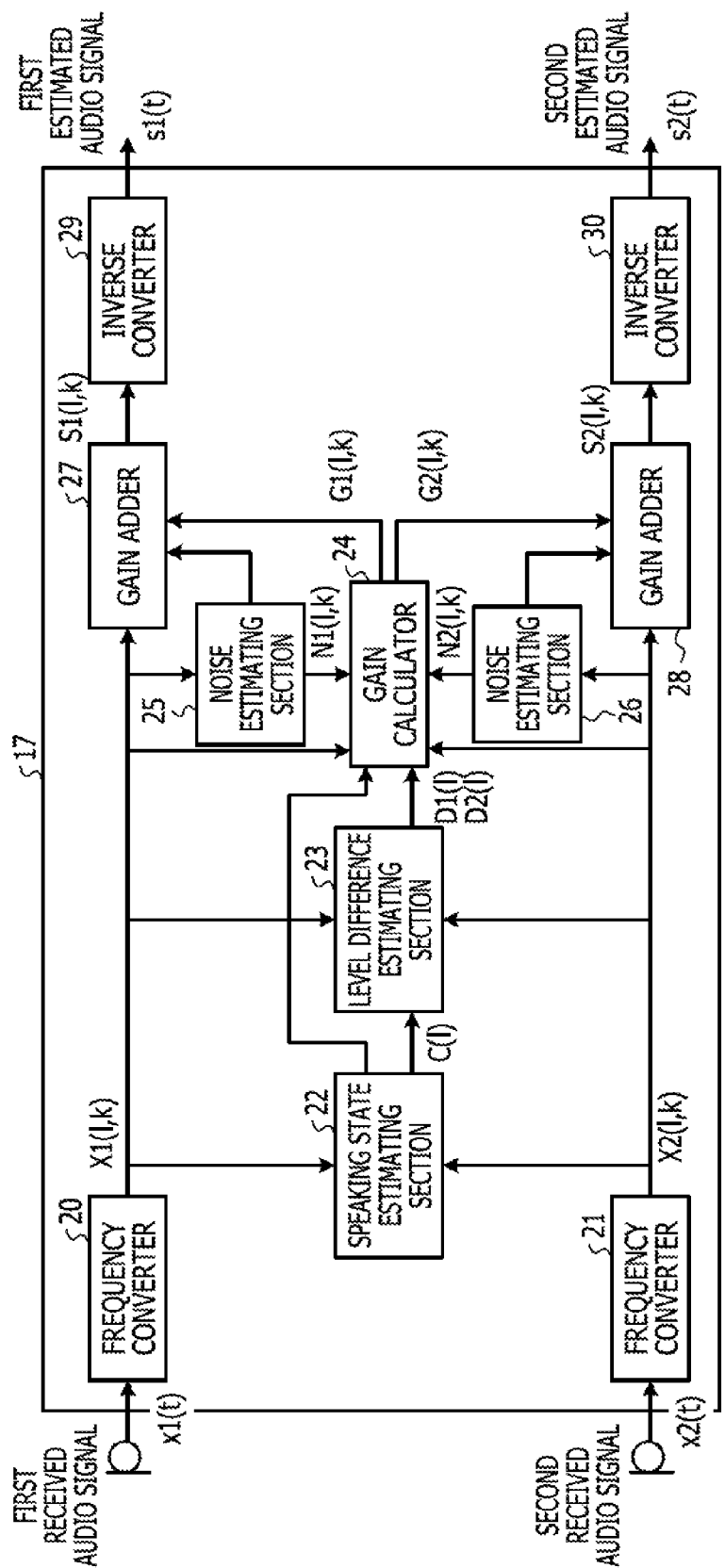
FIG. 3 is an example of a functional block diagram of an automatic gain adjustment device.

FIG. 3 is an example of a functional block diagram of the automatic gain adjustment device 17. The automatic gain adjustment device 17 includes frequency converters 20 and 21, a speaking state estimating section 22, a level difference estimating section 23, a gain calculator 24, noise estimating sections 25 and 26, gain adders 27 and 28, and inverse converters 29 and 30.

The frequency converters 20 and 21 execute frequency conversion on the received audio signals and output audio spectra. The frequency conversion is, for example, a short time discrete Fourier transform (STFT) process. Z conversion or discrete cosine conversion may be applied to the frequency conversion. In the first embodiment, the frequency converter 20 executes the STFT process on a received audio signal $x1(t)$ and outputs an audio spectrum $X1(l, k)$, where t indicates time, l indicates a frame number, and k indicates a frequency range. Similarly, the frequency converter 21 executes the STFT process on a received audio signal $x2(t)$ and outputs an audio spectrum $X2(l, k)$.

The speaking state estimating section 22 estimates, for each of frame numbers l based on the received audio spectra $X1(l, k)$ and $X2(l, k)$, whether the speaker 10 or the speaker 11 is speaking. The speaking state estimating section 22 outputs, as $C(l)$, the results of the presumption for the frame numbers. As a technique for estimating speaking states, "Online Speaker Diarization Based on Bayesian Information Criterion with Multiple Phoneme Classes", the speaker diarization technique disclosed in IEICE Transactions on Fundamentals of Electronics, Communications and Computer Sciences, Vol. J95-D, No. 9, pp. 1749-1758 (2012), or the like may be used, for example.

The level difference estimating section 23 calculates estimated differences between levels of the audio spectra when any of the speaker 10 and the speaker 11 is speaking. The level difference estimating section 23 outputs, as $D1(l)$, estimated differences, calculated for the speaker 10, between levels of the audio spectra. The level difference estimating section 23 outputs, as $D2(l)$, estimated differences, calculated for the speaker 11, between levels of the audio spectra.

The noise estimating sections 25 and 26 estimate background noise spectra for the received audio spectra $X1(l, k)$ and $X2(l, k)$ and output the estimated background noise spectra $N1(l, k)$ and $N2(l, k)$. As a technique for estimating the background noise spectra in the first embodiment, "Suppression of acoustic noise in speech using spectral subtraction" or the technique disclosed in IEEE Trans. Acoust., Speech, Signal Process., vol. 27, pp. 113-120, April 1979 may be used, for example.

The gain calculator 24 calculates the gains based on the received estimated results $C(l)$, the estimated results $D1(l)$ and $D2(l)$, the audio spectra $X1(l, k)$ and $X2(l, k)$, and the background noise spectra $N1(l, k)$ and $N2(l, k)$ and outputs the calculated gains $G1(l, k)$ and $G2(l, k)$.

The gain adders 27 and 28 add the gains to the audio spectra based on the gains calculated by the gain calculator 24. The gain adder 27 receives the audio spectrum $X1(l, k)$, the background noise spectrum $N1(l, k)$, and the gain $G1(l, k)$ and outputs an estimated audio spectrum $S1(l, k)$. The gain adder 28 receives the audio spectrum $X2(l, k)$, the background noise spectrum $N2(l, k)$, and the gain $G2(l, k)$ and outputs an estimated audio spectrum $S2(l, k)$.

The inverse converters 29 and 30 execute inverse Fourier transform on the received audio spectra and output audio signals. The inverse converter 29 executes inverse Fourier transform on the received estimated audio spectrum $S1(l, k)$ and outputs an estimated audio signal $s1(t)$. The inverse converter 30 executes inverse Fourier transform on the received estimated audio spectrum $S2(l, k)$ and outputs an estimated audio signal $s2(t)$.

In the aforementioned manner, the automatic gain adjustment device 17 estimates the gains based on the received audio signals and outputs the estimated audio signals based on the estimated gains. The audio processor 18 executes the audio source separation process based on the estimated audio signals and may maintain the accuracy of the audio source separation process, regardless of a change over time in audio delivery paths.

Figure 4:
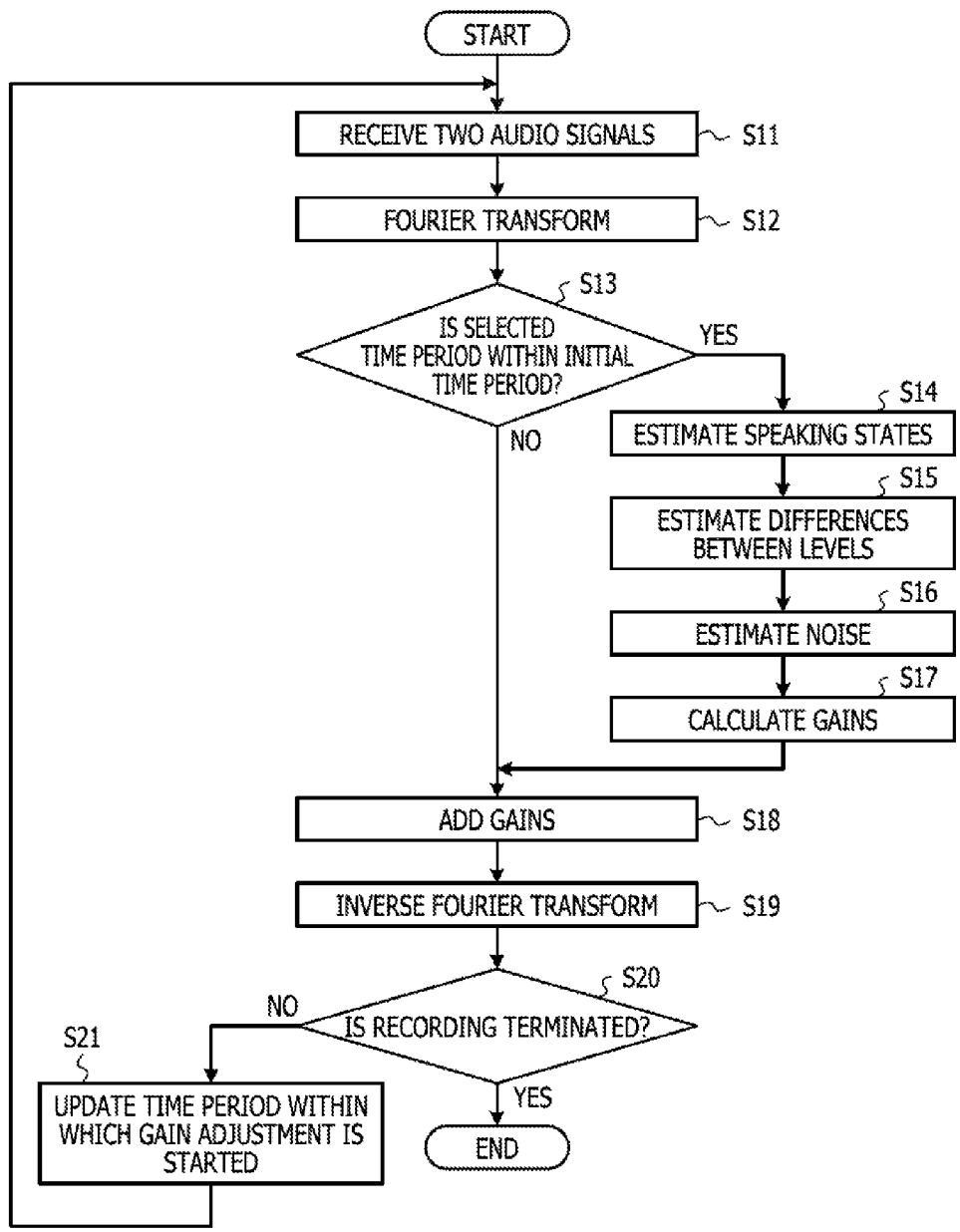
FIG. 4 illustrates an example of the flow of a gain adjustment process by the automatic gain adjustment device.

FIG. 4 illustrates an example of the flow of a gain adjustment process by the automatic gain adjustment device 17. The gain adjustment process may be achieved by causing a processor to execute a program or achieved by hardware in the logic circuit.

When receiving two audio signals (in step S11), the automatic gain adjustment device 17 executes Fourier transform on the received audio signals to generate audio spectra (in step S12).

If the gain adjustment process is frequently executed, the processing load becomes large. Thus, an initial certain time period for recording may be treated as an initial time period, and the gain adjustment process may be executed within the initial time period, for example. The automatic gain adjustment device 17 determines whether or not a selected time period in which the Fourier transform is executed is within the initial time period (in step S13). If the selected time period is within the initial time period (YES in step S13), the automatic gain adjustment device 17 executes a gain calculation process of steps S14 to S17. If the selected time period is not within the initial time period (NO in step S13), the automatic gain adjustment device 17 does not execute the gain calculation process. In the first embodiment, analysis start time p is incremented by time T. Thus, the automatic gain adjustment device 17 may reference the value of the analysis start time p and calculate time elapsed from the time when the recording is started, and the automatic gain adjustment device 17 may determine whether or not the selected time period is within the initial time period.

In the gain calculation process, the automatic gain adjustment device 17 executes a speaking state presumption process of estimating whether or not any of the speakers is speaking (in step S14). The automatic gain adjustment device 17 estimates differences between levels of the audio spectra of the speakers based on the estimated speaker (in step S15). The automatic gain adjustment device 17 estimates background noise spectra based on the audio spectra of the speakers (in step S16). The automatic gain adjustment device 17 calculates corrected gains based on the results of estimating speaking states of the speakers and the results of estimating the differences between the levels (in step S17).

If the automatic gain adjustment device 17 has executed a process of correcting the gains, the automatic gain adjustment device 17 adds the corrected gains to the audio spectra, thereby generating estimated audio spectra (in step S18). The automatic gain adjustment device 17 may improve the accuracy of the estimated audio spectra after the gain adjustment by using the background noise spectra estimated upon the addition of the gains.

The automatic gain adjustment device 17 executes the inverse Fourier transform on the estimated audio spectra after the gain adjustment, thereby generating estimated audio signals (in step S19).

If the automatic gain adjustment device 17 receives a command to terminate the recording from an external, the automatic gain adjustment device 17 determines the termination of the recording (YES in step S20) and terminates the gain adjustment process. If the automatic gain adjustment device 17 does not receive the command to terminate the recording from the external (NO in step S20), the automatic gain adjustment device 17 shifts a time period within which the gain adjustment is to be started to the next time period (in step S21), and the automatic gain adjustment device 17 re-executes the gain adjustment process in steps S11 and later within the next time period.

In the aforementioned manner, the automatic gain adjustment device 17 executes the gain adjustment process on the received two audio signals.

FIG. 5 illustrates a list of variables to be used by each of the frequency converters 20 and 21. In FIG. 5, a column 31 indicates the names of the variables, and a column 32 indicates details of the variables indicated in the column 31.

A variable t indicates arbitrary time of an audio signal. A variable p indicates analysis start time when the analysis of the audio signal is started. A variable T indicates a frame length in the case where a predetermined time period of the audio signal is defined as a single frame. A variable l indicates a frame number that is the order of a frame in the case where the audio signal is divided into frames having the frame length T from the analysis start time p. A variable k indicates each frequency of a frequency range of a spectrum to which the audio signal is converted. A variable n is a number indicating the audio signal input from an n-th microphone and to be processed. A variable xn(t) indicates the audio signal input from the n-th microphone. A variable Xn(l, k) indicates the audio signal spectrum obtained by executing the frequency conversion on the audio signal input from the n-th microphone.

When audio spectra are to be generated from audio signals by the STFT process, the frequency converters 20 and 21 execute the STFT process on the audio signals xn(t−T) to xn(t) divided for frames and output Xn(l, k) (k=0, 1, . . . , T−1). For movements of the frames to be subjected to the STFT process, half overlapping that shifts time corresponding to a half of a frame may be used to remove an effect of damping caused by a window function, for example.

FIG. 6 illustrates a list of a variable to be used by the speaking state estimating section 22. In FIG. 6, a column 33 indicates the name of the variable, and a column 34 indicates a detail of the variable indicated in the column 33.

A variable C(l) indicates the result of estimating a speaking state for an l-th frame. The speaking state estimating section 22 uses the aforementioned speaker diarization technique to estimate, for a frame number l, whether or not a speaker staying on the side of any of the microphones 1 and 2 is speaking. If the speaking state estimating section 22 estimates that a speaker staying near a microphone that has received first input audio is speaking, the speaking state estimating section 22 outputs C(l)=1. If the speaking state estimating section 22 estimates that a speaker staying near a microphone that has received second input audio is speaking, the speaking state estimating section 22 outputs C(l)=2. If the levels of the input audio received by all the microphones are close to each other and the speaking state estimating section 22 is not able to estimate whether or not any of the speakers or if the speaking state estimating section 22 estimates that all the speakers are not speaking, the speaking state estimating section 22 outputs C(l)=0.

FIG. 7 illustrates a list of variables to be used by the level difference estimating section 23. In FIG. 7, a column 35 indicates the names of the variables, and a column 36 indicates details of the variables indicated in the column 35.

A variable d(l) indicates the average of differences between levels of the input audio spectra X1(l, k) and X2(l, k) for frequencies for a frame number l when a speaker staying near a microphone that has received the first or second input audio is speaking, and the average d(l) is calculated according to the following Equation 1.

$$d(l) = \sum_{k=0}^{T-1} \{X1(l, k) - X2(l, k)\}/T \quad \text{Equation 1}$$

A variable Dn(l, k) indicates an estimated difference between levels of the input audio spectra when a speaker staying near a microphone that has received n-th input audio is speaking. If the speaker staying near the microphone that has received the first input audio is speaking or if C(l)=1, an estimated difference D1(l) between levels of the input audio spectra is calculated according to the following Equation 2.

$$D1(l)=(1-\alpha)D1(l-1)+\alpha d(l) \quad \text{Equation 2}$$

If the speaker staying near the microphone that has received the second input audio is speaking, or if C(l)=2, an estimated difference D2(l) between levels of the input audio spectra is calculated according to the following Equation 3.

$$D2(l)=(1-\alpha)D2(l-1)+\alpha d(l) \quad \text{Equation 3}$$

In the equations for calculating the estimated differences Dn(l, k) between the levels, a variable α indicates a predetermined smoothing coefficient. By executing smoothing using the smoothing coefficient, long-term differences between levels are obtained instead of instant differences between levels, and an effect of sudden noise or the like may be reduced. As the smoothing coefficient is increased, an instant effect becomes larger. Thus, when the smoothing coefficient is increased, the effect of the noise is easily received, but environmental changes such as changes in the positions of the speakers are not easily received. Thus, it is preferable that if a speaker is speaking and the amount of sudden noise is large, the smoothing coefficient be set to a small value (α is approximately 0.01) and that if an environmental change such as a change in the position of a speaker is large, the smoothing coefficient be set to a large value (α is approximately 0.1).

The level difference estimating section 23 may estimate differences between levels received by the microphones by executing the aforementioned calculation process when any of the speakers is speaking.

FIG. 8 illustrates a list of a variable to be used by each of the noise estimating sections 25 and 26. In FIG. 8, a column 37 indicates the name of the variable, and a column 38 indicates a detail of the variable indicated in the column 37.

A variable Nn(l, k) indicates a background noise spectrum of an input audio signal received by an n-th microphone. Background noise spectra Nn(l, k) are estimated for audio spectra Xn(l, k). In order to estimate the background noise spectra, "Suppression of acoustic noise in speech using spectral subtraction" or the technique disclosed in IEEE Trans. Acoust., Speech, Signal Process., vol. 27, pp. 113-120, April 1979 is used, for example.

FIG. 9 illustrates a list of variables to be used by the gain calculator 24. In FIG. 9, a column 39 indicates the names of the variables, and a column 40 indicates details of the variables indicated in the column 39.

A variable Vn(l, k) indicates a corrected amount for an input audio signal received by an n-th microphone. A variable Gn(l, k) indicates a gain for the input audio signal received by the n-th microphone. TH1 indicates an audio determination threshold. The audio determination threshold is a threshold for determining whether or not levels of audio signals input from the microphones are sufficiently larger than background noise levels. The ratios SNR of the levels of the audio signals input from the microphones to the background noise levels are calculated as SNR=Xn(l, k)/Nn(l, k).

If SNR>TH1 and C(l)=1, corrected amounts Vn(l, k) are calculated as V1(l, k)=a×V1(l−1, k)+(1−a)×(d(l)−D1(l, k))/2, and V2(l, k)=a×V1(l−1, k)−(1−a)×(d(l)−D1(l, k))/2, where a indicates a smoothing coefficient for the corrected amounts, determining the degrees of effects of past calculated gain values. As the value of the smoothing coefficient a is increased, the effects of the past calculated gain values become larger. Thus, if an environmental change is small, an effect of noise may be reduced by increasing the value of the smoothing coefficient a. If the environmental change is large, the speed of tracking the environmental change may be increased by reducing the value of the smoothing coefficient a.

If SNR>TH1 and C(l)=2, the corrected amounts Vn(l, k) are calculated as V1(l, k)=a×V1(l−1, k)+(1−a)×(d(l)−D2(l, k))/2, and V2(l, k)=a×V1(l−1, k)−(1−a)×(d(l)−D2(l, k))/2.

If SNR>TH1 and C(l)=0, audio with levels from which it is estimated that both speakers are speaking is not input to the microphones, and the corrected amounts Vn(l, k)=Vn(l−1, k).

If SNR TH1, the background noise levels are dominant and V1(l, k)=V2(l, k)=0.

As described above, the gain calculator 24 calculates the gains Gn(l, k) of the n-th microphones as Gn(l, k)=1−Vn(l, k)/Xn(l, k) based on the corrected amounts Vn(l, k) calculated for the ratios SNR and the results C(l). The gain calculator 24 outputs the calculated gains Gn(l, k) to the gain adders 27 and 28.

FIG. 10 illustrates a list of variables to be used by each of the gain adders 27 and 28 and each of the inverse converters 29 and 30. In FIG. 10, a column 41 indicates the names of the variables, and a column 42 indicates details of the variables indicated in the column 41.

A variable Sn(l, k) indicates an estimated audio spectrum to which a gain calculated for an audio signal input from an n-th microphone is added. A variable sn(t) indicates an estimated audio signal obtained by executing the inverse Fourier transform on the estimated audio spectrum Sn(l, k) corresponding to the n-th microphone.

The gain adders 27 and 28 output estimated audio spectra Sn(l, k) based on the input gains Gn(l, k), the audio spectra Xn(l, k), and the background noise spectra Nn(l, k). The estimated audio spectra Sn(l, k) are calculated as Sn(l, k)=max{Gn(l, k)×Xn(l, k), Nn(l, k)}.

The inverse converters 29 and 30 execute the Fourier transform on the input estimated audio spectra Sn(l, k) and output estimated audio signals sn(t).

In the aforementioned manner, the automatic gain adjustment device 17 executes the gain adjustment process on an audio signal received from an n-th microphone and outputs an estimated audio signal.

Second Embodiment

Figure 11:
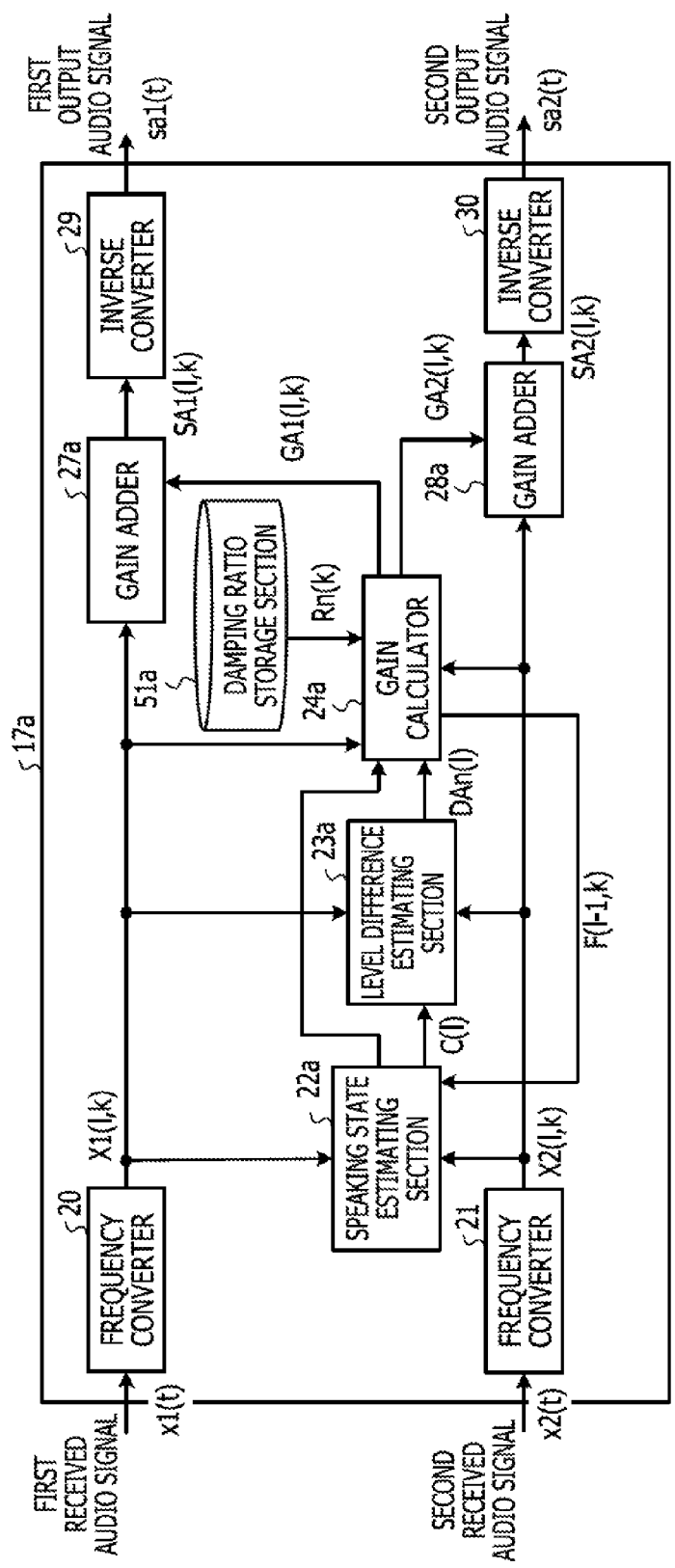
FIG. 11 is an example of a functional block diagram of an automatic gain adjustment device according to a second embodiment.

FIG. 11 is an example of a functional block diagram of an automatic gain adjustment device according to a second embodiment. The automatic gain adjustment device 17a includes the frequency converters 20 and 21, a speaking state estimating section 22a, a level difference estimating section 23a, a gain calculator 24a, a damping ratio storage section 51a, gain adders 27a and 28a, and the inverse converters 29 and 30.

Constituent sections, which are included in the automatic gain adjustment device 17a illustrated in FIG. 11 and have the same functions as those included in the automatic gain adjustment device 17 illustrated in FIG. 3, are indicated by the same reference numbers as those illustrated in FIG. 3, and a description thereof is omitted.

The speaking state estimating section 22a estimates, based on the input audio spectra X1(l, k) and X2(l, k), whether or not any of the speakers 10 and 11 is speaking for each of frame numbers l in the same manner as the speaking state estimating section 22 illustrated in FIG. 3. The speaking state estimating section 22a outputs, as C(l), the results of the presumption for the frame numbers. The speaking state estimating section 22a determines, based on the value of a state variation flag F(l−1, k), whether or not a process of detecting a variation in the speaking states is to be executed. The state variation flag indicates the result of determining whether or not there is a variation in the speaking states. The state variation flag is described later in detail.

The level difference estimating section 23a calculates estimated differences between levels of the audio spectra when any of the speakers 10 and 11 is speaking in the same manner as the level difference estimating section 23 illustrated in FIG. 3. The level difference estimating section 23a outputs, as DA1(l), estimated differences, calculated for the speaker 10, between levels of the audio spectra and outputs, as DA2(l), estimated differences, calculated for the speaker 11, between levels of the audio spectra.

The damping ratio storage section 51a emits white noise from the same positions as the speakers in an environment in which the automatic gain adjustment device 17a is used. The damping ratio storage section 51a measures the input audio spectra output from the frequency converters 20 and 21. The damping ratio storage section 51a stores, as damping ratios Rn(k) based on the measured input audio spectra, the ratios of levels, attenuated in the delivery of the audio from the speakers to the microphones, of the audio spectra for frequencies to levels, attenuated in the delivery of the audio from the speakers to the microphones, of the audio spectra for a predetermined frequency (of, for example, 1 kHz).

The gain calculator 24a calculates the gains based on the input estimated results C(l), the estimated results DA1(l) and DA2(l), the audio spectra X1(l, k) and X2(l, k), and the ratios Rn(k) read from the damping ratio storage section 51a and output the calculated gains GA1(l, k) and GA2(l, k).

The gain adders 27a and 28a add the gains to the audio spectra based on the gains calculated by the gain calculator 24a. The gain adder 27a receives the audio spectrum X1(l, k) and the gain GA1(l, k) and outputs an estimated audio spectrum SA1(l, k). The gain adder 28a receives the audio spectrum X2(l, k) and the gain GA2(l, k) and outputs an estimated audio spectrum SA2(l, k).

The inverse converters 29 and 30 execute the inverse Fourier transform on the input audio spectra and output audio signals. The inverse converter 29 executes the inverse Fourier transform on the input estimated audio spectrum SA1(l, k) and outputs an estimated audio signal sa1(t). The inverse converter 30 executes the inverse Fourier transform on the input estimated audio spectrum SA2(l, k) and outputs an estimated audio signal sa2(t).

In the aforementioned manner, the automatic gain adjustment device 17a estimates the gains based on the input audio signals and outputs the estimated audio signals based on the estimated gains. The audio processor 18 executes the audio source separation process based on the estimated audio signals and may maintain the accuracy of the audio source separation process, regardless of a change over time in the audio delivery paths.

Figure 12:
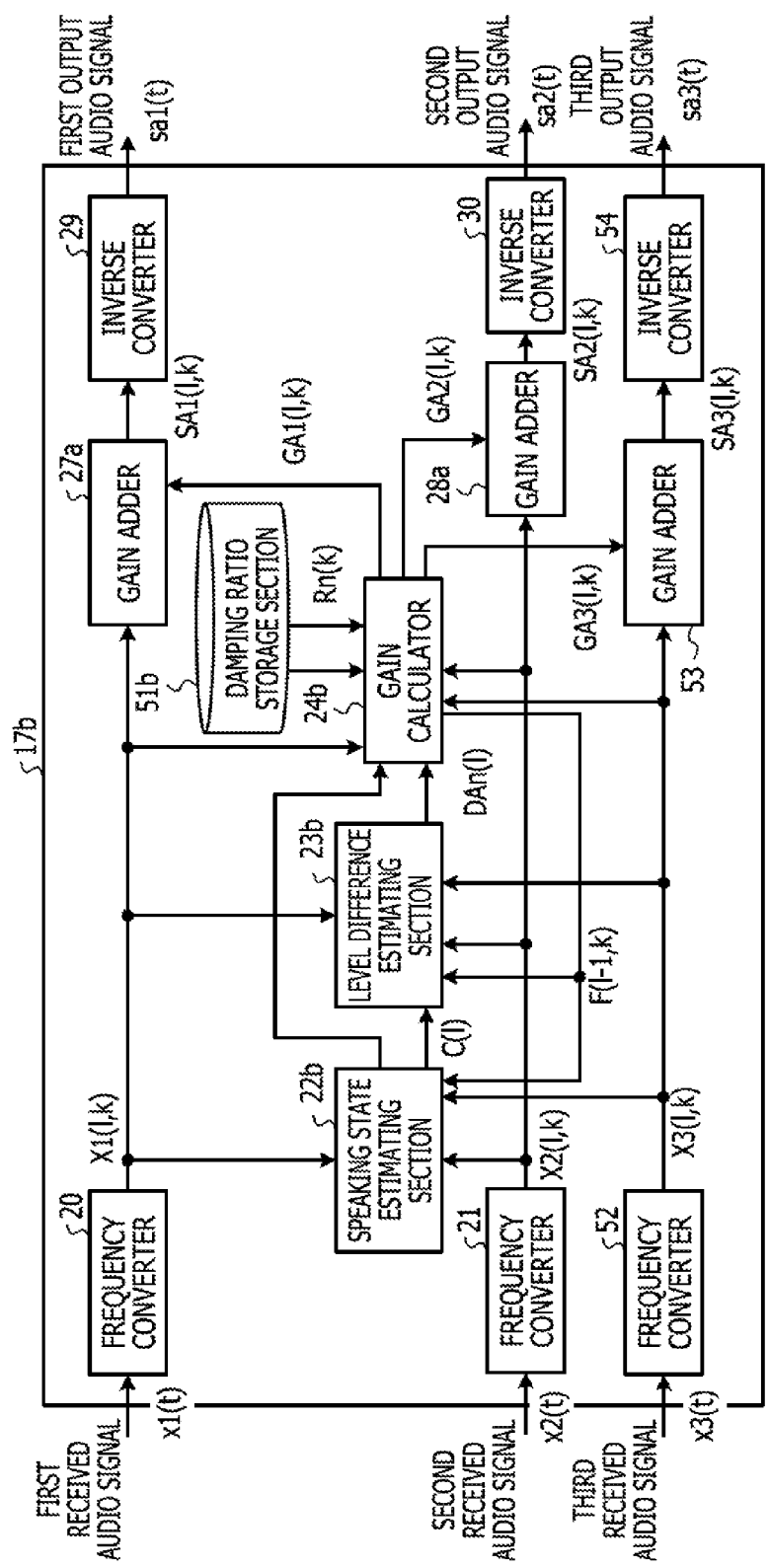
FIG. 12 is an example of a functional block diagram of the automatic gain adjustment device if the number of input audio signals is three.

FIG. 12 is an example of a functional block diagram of an automatic gain adjustment device if the number of input audio signals is three. The audio gain adjustment apparatus 17b illustrated in FIG. 12 is configured by adding a frequency converter 52 for processing an input audio signal x3(t), a gain adder 53, and an inverse converter 54 to the audio gain adjustment apparatus 17a illustrated in FIG. 11. In the audio gain adjustment apparatus 17b, a speaking state estimating section 22b, a level difference estimating section 23b, and a gain calculator 24b receive an input audio spectrum X3(l, k) corresponding to the input audio signal x3(t). In the speaking state estimating section 22b, the level difference estimating section 23b, and the gain calculator 24b that are included in the automatic gain adjustment device 17b, processes to be executed on the input audio spectra Xn(l, k) are independent for the input audio spectra Xn(l, k). Thus, if the number of input audio signals is increased, it is sufficient if the number of input audio spectra to be processed by the speaking state estimating section 22b, the level difference estimating section 23b, and the gain calculator 24b is increased. In FIG. 3 described in the first embodiment, by increasing the number of input audio spectra to be processed by the speaking state estimating section 22, the level difference estimating section 23, and the gain calculator 24 based on the number of input audio signals, the gain adjustment process may be executed on two or more input audio signals.

Operations of the automatic gain adjustment device 17b are described below in detail. The automatic gain adjustment device 17b include all the constituent sections of the automatic gain adjustment device 17a. Blocks that are included in the automatic gain adjustment device 17b and indicated by the same reference numbers and symbols as those included in the automatic gain adjustment device 17a have the same functions as those included in the automatic gain adjustment device 17a, and a detailed description of the automatic gain adjustment device 17b is omitted.

Figure 13:
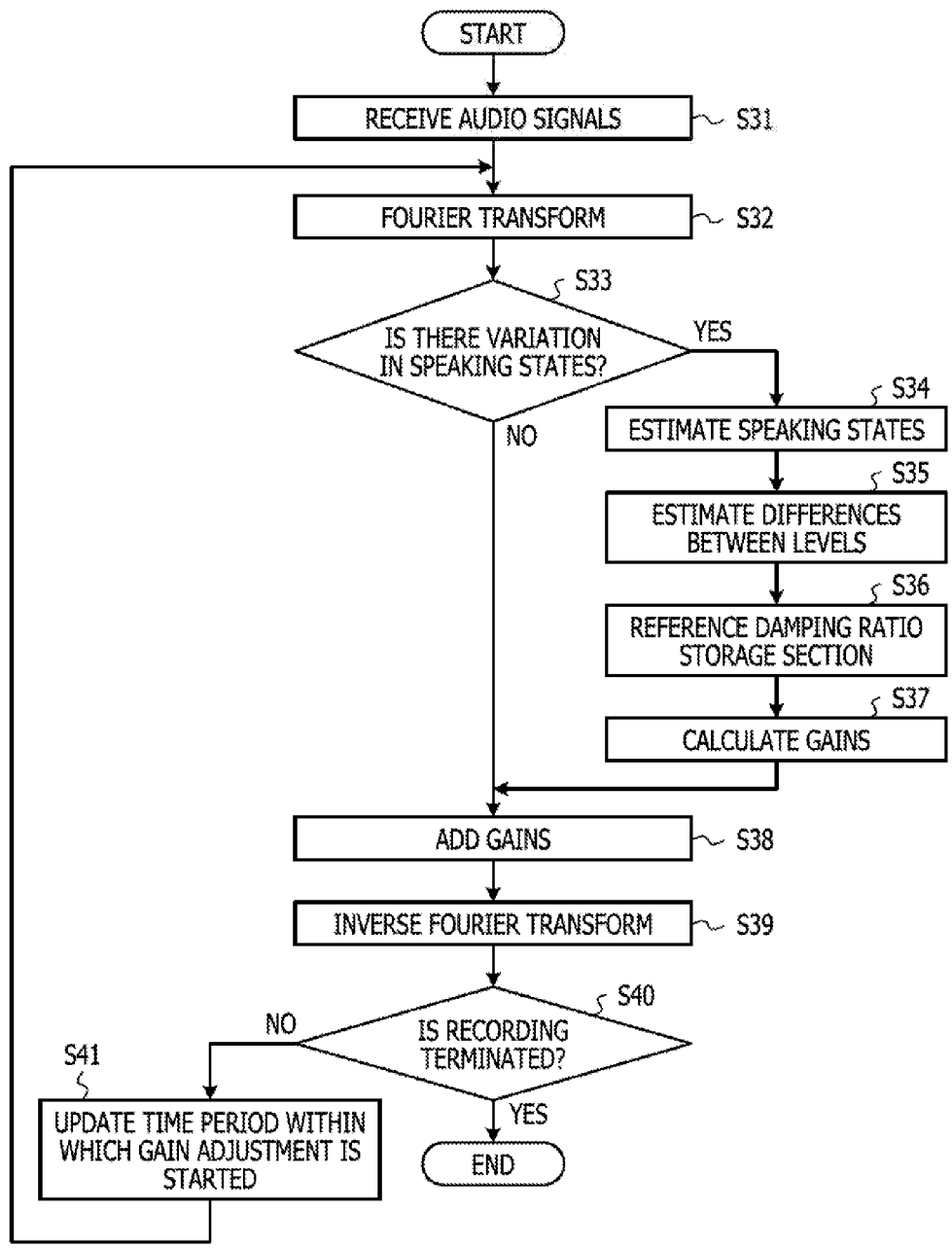
FIG. 13 illustrates an example of the flow of a gain adjustment process by the automatic gain adjustment device.

FIG. 13 illustrates an example of the flow of a gain adjustment process by the automatic gain adjustment device 17b. The gain adjustment process may be achieved by causing the processor to execute a program or achieved by hardware in a logic circuit.

When receiving audio signals corresponding to input audio (in step S31), the automatic gain adjustment device 17b executes frequency conversion on the received audio signals by Fourier transform or the like and generates audio spectra (in step S32).

If the gains are frequently adjusted, the processing load becomes large. It is, therefore, sufficient if the gain adjustment process is executed when variations in the audio spectra are larger than a predetermined threshold. The automatic gain adjustment device 17b determines whether or not there is a variation in the speaking states that causes the execution of the gain adjustment process within a selected time period in which the Fourier transform process is to be executed (in step S33). If there is the variation in the speaking states (YES in step S33), the automatic gain adjustment device 17b executes a gain calculation process of steps S34 to S37. If there is not the variation in the speaking states (NO in step S33), the automatic gain adjustment device 17b does not execute the gain calculation process.

In the gain calculation process, the automatic gain adjustment device 17b executes a speaking state presumption process of estimating whether or not any of the speakers is speaking (in step S34). The automatic gain adjustment device 17b estimates differences between spectrum levels of the speakers based on the estimated speaker (in step S35). The automatic gain adjustment device 17b reads a stored damping ratio from the damping ratio storage section (in step S36). The automatic gain adjustment device 17b calculates corrected gains based on the results of estimating the speaking states and the damping ratio (in step S37).

When executing the gain correction process, the automatic gain adjustment device 17b adds the corrected gains to the audio spectra and generates estimated audio spectra (in step S38). The automatic gain adjustment device 17b references the stored damping ratio upon the gain calculation and may reduce the calculation load caused by the gain calculation.

The automatic gain adjustment device 17b executes inverse Fourier transform on the estimated audio spectra after the gain adjustment and generates estimated audio signals (in step S39).

If the automatic gain adjustment device 17b has received a command to terminate recording from an external, the automatic gain adjustment device 17b determines the termination of the recording (YES in step S40) and terminates the gain adjustment process. If the automatic gain adjustment device 17b has not received the command to terminate the recording from the external (NO in step S40), the automatic gain adjustment device 17b shifts a time period within which the gain adjustment is to be started to the next time period (in step S41), and the automatic gain adjustment device 17b re-executes the gain adjustment process of steps S32 and later within the next time period.

In the aforementioned manner, the automatic gain adjustment device 17b executes the gain adjustment process on the received audio signals.

FIG. 14 illustrates a list of variables to be executed by each of the frequency converters 20, 21, and 52. In FIG. 14, a column 61 indicates the names of the variables, and a column 62 indicates details of the variables indicated in the column 61.

A variable t indicates arbitrary time of an audio signal. A variable p indicates analysis start time when the analysis of the audio signal is started. A variable T indicates a frame length in the case where a predetermined time period of the audio signal is defined as a single frame. A variable l indicates a frame number that is the order of a frame in the case where the audio signal is divided into frames having the frame length T from the analysis start time p. A variable k indicates each frequency of a frequency range of an audio spectrum to which the audio signal is converted. A variable n is a number indicating the audio signal input from an n-th microphone and to be processed. A variable xn(t) indicates the audio signal input from the n-th microphone. A variable Xn(l, k) indicates an audio signal spectrum obtained by executing the frequency conversion on the audio signal input from the n-th microphone. A variable Nn(l, k) indicates a background noise spectrum of the audio signal input from the n-th microphone.

When audio spectra are to be generated from audio signals by the STFT process, the frequency converters 20, 21, and 52 execute the STFT process on the audio signals xn(t−T) to xn(t) divided for frames and output Xn(l, k) (k=0, 1, ..., T−1).

FIG. 15 illustrates the state variation flag for determining whether or not the gain calculation process is to be executed by the speaking state estimating section 22b. A column 63 indicates a variable F(l−1, k) indicating the state variation flag. A column 64 indicates a detail of the variable indicated in the column 63. The state variation flag is output from the gain calculator 24b and input to the speaking state estimating section 22b and the level difference estimating section 23b. The value of the state variation flag is determined based on an input audio spectrum preceding one or more frames. For example, the inclination of a regression line from an estimated level difference DAn(l−x, k) to an estimated level difference DAn(l, k) is calculated. If the calculated inclination is smaller than a set threshold, it may be determined that there is no variation in the speaking states. The calculation of a value of the inclination is started in the case where an initial value of an equation for calculating the estimated level difference DAn(l, k) is set to a large value, and the calculation of a value of the inclination is started in the case where the initial value of the equation for calculating the estimated level difference DAn(l, k) is set to a small value. If both values of the inclination are equal to or smaller than a certain value, it may be determined that there is no variation in the speaking states.

The speaking state estimating section 22b, the level difference estimating section 23b, and the gain calculator 24b determine, based on the value of the state variation flag, whether or not the gain calculation process is to be executed for a frame number I. If F(l−1, k)=1, it is determined that a variation in a speaking state that exceeds a predetermined value has occurred, and the speaking state estimating section 22b, the level difference estimating section 23b, and the gain calculator 24b execute the gain calculation process.

If F(l−1, k)=0, it is determined that a variation in a speaking state that causes the execution of the gain calculation process has not occurred, and the speaking state estimating section 22b, the level difference estimating section 23b, and the gain calculator 24b do not execute the gain calculation process, and the gain adders 27a, 28a, and 53 execute a process of adding gains based on the gains and corrected amounts before one frame.

In the aforementioned manner, the automatic gain adjustment device 17b may suppress consumption power and adjust the gains with high accuracy by executing the gain calculation process based on the value of the state variation flag.

FIG. 16 illustrates a list of a variable to be used by the speaking state estimating section 22b. In FIG. 16, a column 65 indicates the name of the variable, and a column 66 indicates a detail of the variable indicated in the column 65.

A variable C(l) indicates the results of estimating the speaking states for an l-th frame. If the value of the state variation flag F(l−1, k) is 1, the speaking state estimating section 22b executes a process of estimating the speaking states. The speaking state estimating section 22b uses the aforementioned speaker diarization technique to estimate, for each of the frame numbers I, whether or not a speaker staying on the side of any of the microphones is speaking. If the speaking state estimating section 22b estimates that a speaker staying near a microphone that has received first input audio is speaking, the speaking state estimating section 22b outputs C(l)=1. If the speaking state estimating section 22b estimates that a speaker staying near a microphone that has received second input audio is speaking, the speaking state estimating section 22b outputs C(l)=2. If the speaking state estimating section 22b estimates that a speaker staying near a microphone that has received third input audio is speaking, the speaking state estimating section 22b outputs C(l)=3. If levels of audio input to all the microphones are close to each other and the speaking state estimating section 22b is not able to estimate whether or not any of the speakers is speaking or the speaking state estimating section 22b estimates that all the speakers are not speaking, the speaking state estimating section 22b outputs C(l)=0.

FIG. 17 illustrates a list of variables to be used by the level difference estimating section 23b. In FIG. 17, a column 67 indicates the names of the variables, and a column 68 indicates details of the variables indicated in the column 67.

A variable dnm(l) indicates an instant difference between the level of an audio spectrum based on n-th input audio and the level of an audio spectrum based on m-th input audio. In this case, n and m are integers corresponding to the numbers of microphones and are different from each other. Since the automatic gain adjustment device 17b receives first, second, and third audio signals from three microphones, differences between the level of the first input audio signal and levels of the second and third input audio signals are expressed by d12(l)=X1(l, k)−X2(l, k) and d13(l)=X1(l, k)−X3(l, k). The second embodiment describes the case where differences between the level of the audio spectrum X1(l, k) and the levels of the other audio spectra are used. In the second embodiment, however, the other audio spectrum X2(l, k) or X3(l, k) may be used as a standard audio spectrum, and differences between the level of the standard audio spectrum and the levels of the other audio spectra may be used, or differences between the levels may be comprehensively used and estimated differences between the levels may be calculated.

A variable DAn(l, k) indicates an estimated level difference when a speaker staying near a microphone that has received n-th input audio is speaking. If a speaker staying near a microphone that has received first input audio is speaking or if C(l)=1, an estimated level difference DA1(l) is expressed by DA1(l)=(1−β)DA1(l−1, k)+βdl2(l, k). If a speaker staying near a microphone that has received second input audio is speaking or if C(l)=2, an estimated level difference DA2(l) is expressed by DA2(l)=(1−β)DA2(l−1, k)+βdl2(l, k). If a speaker staying near a microphone that has received third input audio is speaking or if C(l)=3, an estimated level difference DA3(l) is expressed by DA3(l)= (1−β)DA3(l−1, k)+βdl3(l, k).

In the equations for calculating the estimated level differences DAn(l, k), the variable β indicates a predetermined smoothing coefficient. By executing smoothing using the smoothing coefficient, long-term differences between levels are obtained instead of instant differences between levels, and an effect of sudden noise or the like may be reduced. As the smoothing coefficient is increased, an instant effect becomes larger. Thus, when the smoothing coefficient is increased, the effect of the noise is easily received, but environmental changes such as changes in the positions of the speakers are not easily received. Thus, it is preferable that if a speaker is speaking and the amount of sudden noise is large, the smoothing coefficient be set to a small value (β is set to approximately 0.01) and that if an environmental change such as a change in the position of a speaker is large, the smoothing coefficient be set to a large value (β is set to approximately 0.1).

The level difference estimating section 23b may estimate differences between levels received by the microphones by executing the aforementioned calculation process when any of the speakers is speaking.

FIG. 18 illustrates a damping ratio table stored for frequencies of a spectrum in the damping ratio storage section 51b. In FIG. 18, a column 69 indicates values of the frequencies, and a column 70 indicates damping ratios of levels of the spectrum for the frequencies to a level of the spectrum for the predetermined frequency.

The damping ratio table is prepared in advance in an environment in which the techniques disclosed herein are able to be used. In order to generate the damping ratio table, the damping ratio storage section 51b emits white noise from the same positions as the speakers and measures input audio spectra corresponding to the microphones. Then, regarding the input audio spectra corresponding to the microphones, the ratios of levels of the input audio spectra for the frequencies to levels of the input audio spectra for a predetermined frequency are calculated as damping ratios Rn(k) and stored in the damping ratio storage section 51b. Regarding the damping ratios Rn(k), n corresponds to a microphone that has received n-th input audio.

FIG. 19 illustrates a list of variables to be used by the gain calculator 24b. In FIG. 19, a column 71 indicates the names of the variables, and a column 72 indicates details of the variables indicated in the column 71.

A variable VAn(l, k) indicates a corrected amount for an audio signal input from an n-th microphone. A variable rn(l, k) indicates a measured damping ratio of the audio signal input from the n-th microphone. TH2 indicates a predetermined threshold for evaluating the difference between the measured damping ratio and a damping ratio stored in the damping ratio storage section 51b. An optimal value of the threshold TH2 may be searched, while sweeping is executed during the correction process. A variable Y is a correction coefficient to be used for the calculation of the corrected amount. The correction coefficient Y is a coefficient for determining a weight to be added to the difference between the measured damping ratio and the damping ratio stored in the damping ratio storage section 51b.

Measured damping ratios rn(l, k) when the number of speaking audio sources is 1 may be calculated as r1(l, k)=DA1(l, k)/DA1(l, k_1 kHz), r2(l, k)=DA2(l, k)/DA2(l, k_1 kHz), and r3(l, k)=DA3(l, k)/DA3(l, k_1 kHz). In this case, a variable k_1 kHz indicates a band number corresponding to a frequency of 1 kHz. This is due to the fact that a standard frequency for the calculation of the damping ratios is defined as 1 kHz in the second embodiment, as described above.

The gain calculator 24b calculates corrected amounts VAn(l, k) based on magnitude relationships between the measured damping ratios rn(l, k) and the damping ratio stored in the damping ratio storage section 51b in the following manner. The gain calculator 24b determines the value of the state variation flag F(l, k) based on the magnitude relationships between the measured damping ratios rn(l, k) and the damping ratio stored in the damping ratio storage section 51b.

If |rn(l, k)−Rn(k)|>TH2, VAn(l, k)=VAn(l−1, k)−Y{rn(l, k)−Rn(k)} and F(l, k)=1.

If |rn(l, k)−Rn(k)|≤TH2, VAn(l, k)=VAn(l−1, k) and F(l, k)=0.

The gain calculator 24b calculates, based on the calculated corrected amounts VAn(l,k), gains GAn(l, k) as GAn(l, k)=1 VAn(l, k)/Xn(l, k).

The gain calculator 24b outputs the calculated gains GAn(l, k) to the gain adders 27a, 28a, and 53 corresponding to the input audio signals. In addition, the gain calculator 24b outputs the determined value of the state variation flag F(l, k) to the speaking state estimating section 22b and the level difference estimating section 23b.

As described above, the gain calculator 24b stores the standard damping ratio in advance and may reduce an amount to be calculated for the gain calculation while maintaining the accuracy of the calculation.

FIG. 20 illustrates a list of variables to be used by each of the gain adders 27a, 28a, and 53. In FIG. 20, a column 73 indicates the names of the variables, and a column 74 indicates details of the variables indicated in the column 73.

A variable n indicates a predetermined magnification for a gain GAn(l, k) in an operation of adding the gain to an n-th input audio signal. If VAn(l, k)=VA1(l−1, k) or if a corrected amount does not vary, the magnification n=1. If VAn(l, k) ≠ VA1(l−1, k) or if the corrected amount varies, the magnification n=0.5 that reduces an effect of the variation in the corrected amount. Appropriately setting the magnification n in the aforementioned manner may reduce an instant large variation in the input audio signal.

A variable SAn(l, k) indicates an estimated spectrum after the addition of the gain to an audio spectrum of the audio signal input from an n-th microphone. The gain adders 27a, 28a, and 53 correct input audio spectra based on the gains GAn(l, k) input from the gain calculator 24b and output estimated spectra SAn(l, k). The estimated spectra SAn(l, k) are calculated as SAn(l, k)=Xn(l, k)×ξn×GAn(l, k).

In the second embodiment, after the gain calculator 24b calculates the gains GAn(l, k), the gain adders 27a, 28a, and 53 calculate the estimated spectra SAn(l, k). The gain adders 27a, 28a, and 53, however, may receive the corrected amounts VAn(l, k) and calculate the estimated spectra SAn(l, k) based on the corrected amounts VAn(l, k). This may reduce the calculation load, caused by the calculation of the gains GAn(l, k), of the gain calculator 24b.

Figure 21:
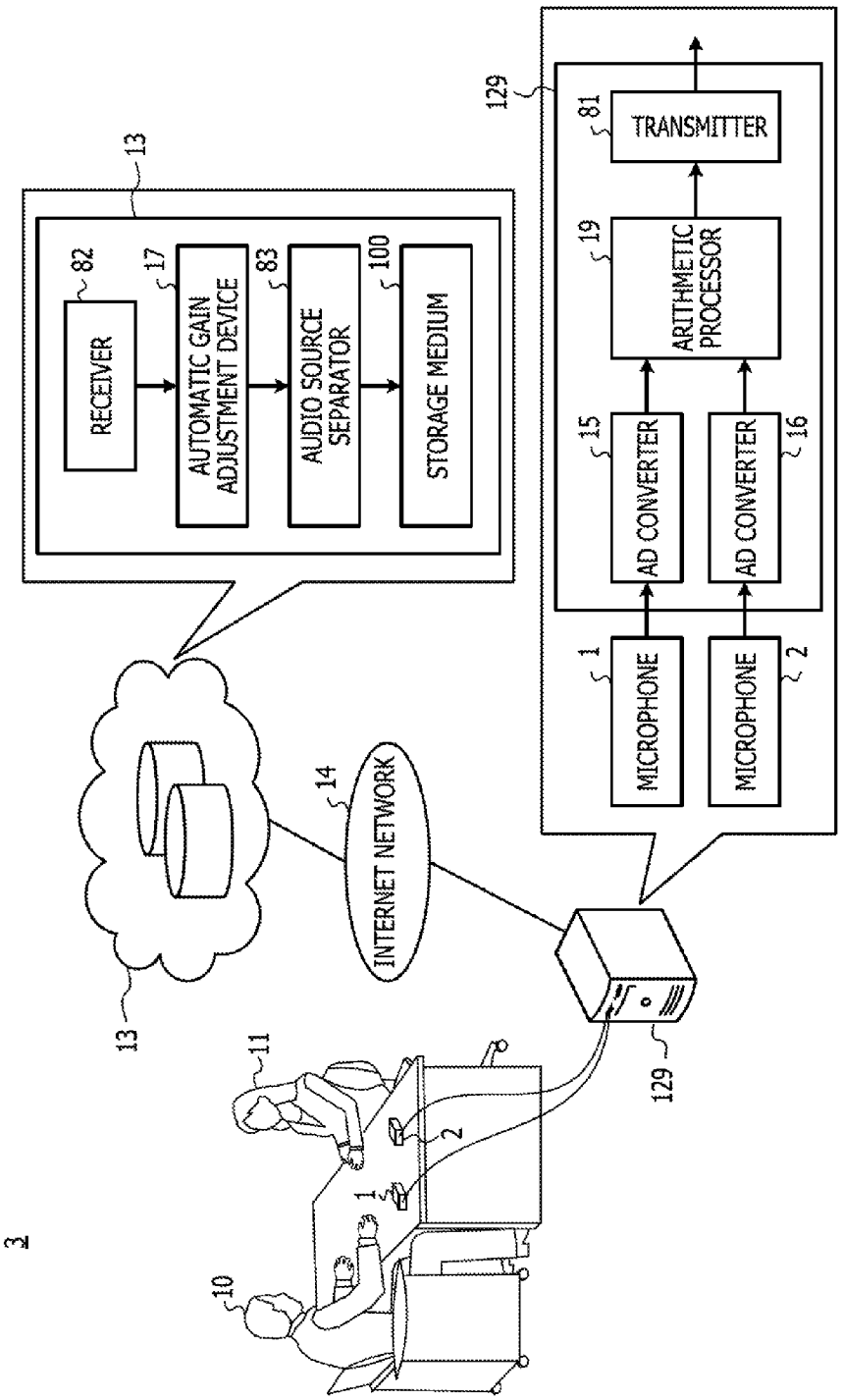
FIG. 21 illustrates an example of the configuration of an audio collection system using the gain adjustment apparatus.

FIG. 21 illustrates an example of the configuration of an audio collection system using the gain adjustment apparatus. In FIG. 21, the audio collection system 3 includes the microphones 1 and 2, a collecting apparatus 129, an Internet network 140, and a server 13.

The microphones 1 and 2 receive audio spoken by the speakers 10 and 11. The microphones 1 and 2 transmit analog signals of the received audio to the collecting apparatus 129.

The collecting apparatus 129 includes the AD converters 15 and 16, the arithmetic processor 14, and a transmitter 81. The AD converters 15 and 16 convert the input audio of the analog signals received from the microphones 1 and 2 to digital signals. The arithmetic processor 14 executes digital signal processing on the input audio converted to the digital signals by the AD converters 15 and 16 and generates an audio file. The transmitter 81 transmits the generated audio file to the Internet network 140. FIG. 21 illustrates a conceptual diagram of the Internet network 140 to which multiple communication devices are able to be connected. In the second embodiment, the Internet network 140 delivers the audio file received from the collecting apparatus 129 to the server 13.

The server 13 includes a receiver 82, the automatic gain adjustment device 17, an audio source separator 83, and a storage medium 100. The receiver 82 receives the audio file delivered from the Internet network 140. The automatic gain adjustment device 17 may be any of the automatic gain adjustment devices 17, 17a, and 17b. The automatic gain adjustment device 17 adjusts gains of the audio file received by the receiver 82 and outputs the adjusted gains. The audio source separator 83 separates the audio file with the adjusted gains into the audio sources corresponding to the speakers. The audio source separator 83 writes the separated audio sources in the storage medium 100.

In the aforementioned manner, the automatic gain adjustment device 17 is installed in the server 13 connected to the Internet network 140 and may adjust gains for audio files transmitted from multiple collecting apparatuses 129 connected to the Internet network 140 and centrally manage the collecting apparatuses 129.

Figure 22:
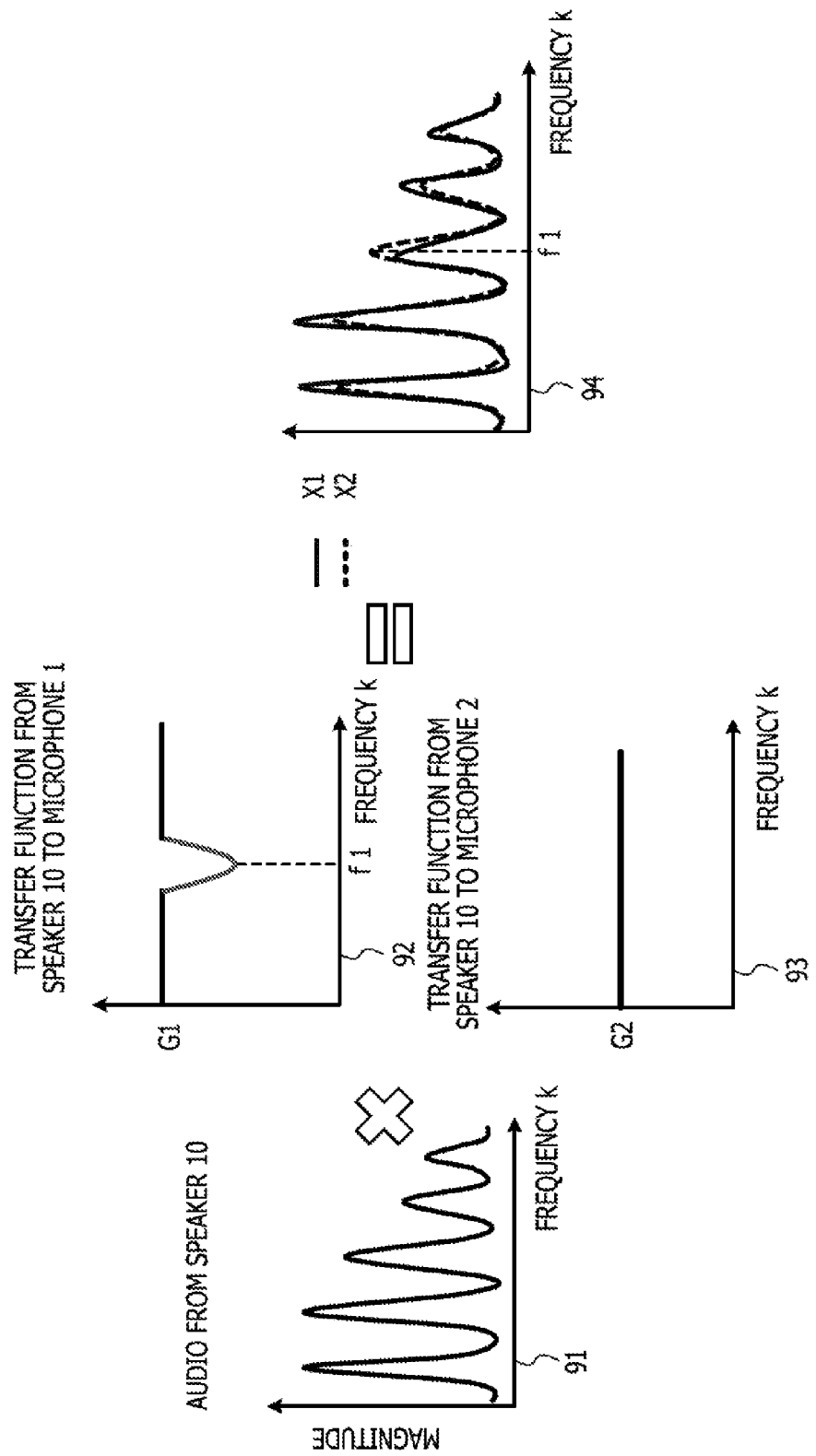
FIG. 22 describes an audio process to be executed when automatic gain adjustment is not executed.

FIG. 22 describes an audio process to be executed when the automatic gain adjustment is not executed. The microphones 1 and 2 and the speaker 10 that are indicated in FIG. 22 are the same as those illustrated in FIG. 21. A graph 91 indicates an audio spectrum obtained by executing Fourier transform on an audio signal received from the speaker 10. A graph 92 indicates a transfer function from the speaker 10 to the microphone 1. In the graph 92, when the frequency is f1, the value of the transfer function is significantly reduced. A graph 93 indicates a transfer function from the speaker 10 to the microphone 2. While a value G2 of the transfer function indicated in the graph 93 is smaller than a value G1 of the transfer function indicated in the graph 92, the value of the transfer function indicated in the graph 92 when the frequency is f1 is smaller than G2.

In a graph 94, a spectrum X1 indicates an audio spectrum output from the microphone 1, and a spectrum X2 indicates an audio spectrum output from the microphone 2. If the transfer functions to the microphones 1 and 2 are at the levels G1 and G2, respectively, the audio spectrum X1 is larger than the audio spectrum X2. In the example illustrated in FIG. 22, however, the value of the transfer function from the speaker 10 to the microphone 1 is significantly reduced, and the audio spectrum X2 is larger than the audio spectrum X1 for the frequency f1 in the graph 94.

For example, the audio source separator 83 illustrated in FIG. 21 separates the audio sources from one another based on the magnitude relationship between the audio spectra. When the magnitude relationship is reversed due to the damping of a transfer function or the like, the audio sources may be inappropriately separated from one another and the inappropriate separation may reduce the quality of the audio file.

Figure 23:
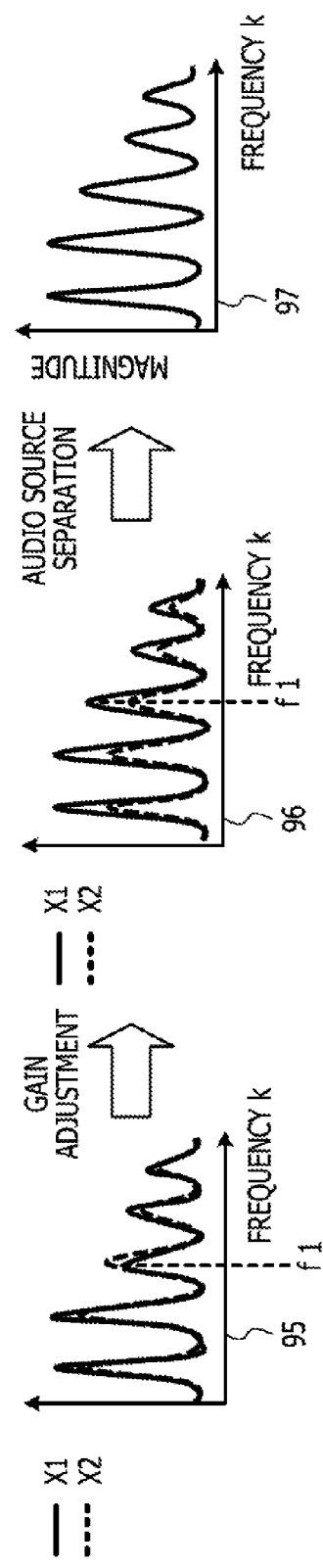
FIG. 23 describes an audio process to be executed when the automatic gain adjustment is executed.

FIG. 23 describes an audio process to be executed when the automatic gain adjustment is executed. In FIG. 23, a graph 95 indicates the audio spectra acquired under the same condition as the graph 94 illustrated in FIG. 22. A graph 96 indicates the audio spectra after the gain adjustment by the automatic gain adjustment device 17. In the graph 95, the audio spectrum X2 is larger than the audio spectrum X1 for the frequency f1. In the graph 96, however, the audio spectrum X1 is larger than the audio spectrum X2 for the frequency f1 due to the gain adjustment, like magnitude relationships between the audio spectra X1 and X2 for other frequencies. A graph 97 indicates the results of executing the audio source separation process on the audio spectra after the gain adjustment. By executing the gain adjustment to correct the magnitude relationships between the audio spectra to obtain appropriate magnitude relationships, the undistorted audio spectrum may be extracted, as indicated in the graph 97.

A computer program that causes a computer to execute the aforementioned gain adjustment processes, and a non-transitory computer-readable storage medium storing the program, are included in the techniques disclosed herein. The non-transitory computer-readable storage medium is a memory card such as an SD memory card, for example. The computer program may not be stored in the storage medium and may be transferred via a network such as a telecommunications line, a wireless communication line, a wired communication line, or the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A gain adjustment apparatus comprising:
a first output device configured to output a first audio signal;
a second output device configured to output a second audio signal;
a memory; and
a processor coupled to the memory and configured to:
convert the first audio signal and the second audio signal to a first frequency spectrum and a second frequency spectrum;
calculate an estimated difference between the first frequency spectrum and the second frequency spectrum based on a comparison of the first frequency spectrum with the second frequency spectrum; and
output a first and second adjustment spectra corresponding to the first and second frequency spectra, the first and second adjustment spectra being adjusted on the basis of the first and second frequency spectra and the estimated difference.

2. The gain adjustment apparatus according to claim 1, wherein the processor calculates the estimated difference based on the average of differences between the frequency spectra in a predetermined frequency range.

3. The gain adjustment apparatus according to claim 1, wherein the processor estimates background noise levels of the audio signals output from the first and second output devices and calculates the gains for the frequency spectra based on the frequency spectra, the estimated difference, and the background noise levels.

4. The gain adjustment apparatus according to claim 1, wherein the memory stores damping ratios that are the ratios of levels, attenuated in the delivery of audio from speakers to the output devices, of the frequency spectra for frequencies to levels, attenuated in the delivery of the audio from the speakers to the output devices, of the frequency spectra for a predetermined frequency, and
wherein the processor calculates the gains for the frequency spectra based on the frequency spectra, the estimated difference, and the damping ratios.

5. The gain adjustment apparatus according to claim 1, wherein the processor detects a variation in a peripheral environment based on the estimated difference and calculates the gains for the frequency spectra based on the result of detecting the variation in the peripheral environment.

6. The gain adjustment apparatus according to claim 1, wherein the processor calculates the estimated difference based on the frequency spectra in a time period in which the frequency spectra include an audio signal from a single audio source.

7. The gain adjustment apparatus according to claim 6, wherein the processor extracts, based on the result of executing an audio source separation process on the frequency spectra subjected to the gain adjustment based on the calculated gains, a desired signal in a time period in which the audio signal from the single audio source includes an audio signal other than the desired signal in the frequency spectra.

8. A gain adjustment method comprising:
outputting, by a processor, a first audio signal and a second audio signal;
converting, by a processor, the first audio signal and the second audio signal to a first frequency spectrum and a second frequency spectrum;
calculating, by a processor, an estimated difference between the first frequency spectrum and the second frequency spectrum based on a comparison of the first frequency spectrum with the second frequency spectrum; and
outputting, by a processor a first and second adjustment spectra corresponding to the first and second frequency spectra, the first and second adjustment spectra being adjusted on the basis of the first and second frequency spectra and the estimated difference.

* * * * *